United States Patent
Nakano

(10) Patent No.: US 7,215,593 B2
(45) Date of Patent: May 8, 2007

(54) SEMICONDUCTOR STORAGE DEVICE

(75) Inventor: Hiroaki Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/560,650

(22) Filed: Nov. 16, 2006

(65) Prior Publication Data

US 2007/0070786 A1    Mar. 29, 2007

Related U.S. Application Data

(62) Division of application No. 11/002,243, filed on Dec. 3, 2004, now Pat. No. 7,149,133.

(30) Foreign Application Priority Data

Aug. 23, 2004    (JP)    ............................. 2004-242454

(51) Int. Cl.
    *G11C 7/00*    (2006.01)
(52) U.S. Cl. ............ 365/230.06; 365/203; 365/230.08; 365/189.05
(58) Field of Classification Search ........... 365/230.06, 365/203, 230.08, 189.05
    See application file for complete search history.

(56) References Cited

U.S. PATENT DOCUMENTS 6,081,452 A     6/2000 Ohta
6,614,711 B2 *  9/2003 Schreck ................. 365/230.06
6,621,745 B1 *  9/2003 Manea .................. 365/185.23
6,847,563 B2    1/2005 Koshikawa

FOREIGN PATENT DOCUMENTS

JP    2002-63795    2/2002

OTHER PUBLICATIONS

Daisaburo Takashima, et al., "A Cell Transistor Scalable Array Architecture for High-Density DRAMs", 2001 Symposium on VLSI Circuits Digest of Technical Papers, 2001, pp. 31-32.

* cited by examiner

*Primary Examiner*—Son Dinh
*Assistant Examiner*—N Nguyen
(74) *Attorney, Agent, or Firm*—Oblon, Spivak, McClelland, Maier & Neustadt, P.C.

(57) ABSTRACT

A semiconductor memory device includes a memory cell array in which a plurality of memory cells are arranged in a matrix form, a plurality of word lines connected to the memory cells, a row decoder including a plurality of decode sections and configured to receive first and second address signals for selecting the word lines, each of the decode sections which is provided for a respective one of the word lines, and includes first and second MOS transistors connected in series, the first MOS transistor having its gate electrode connected to receive the first address signal, the second MOS transistor having its gate electrode connected to receive the second address signal, the row decoder outputting a first signal for controlling the word lines, and a control circuit which delays the second address signal in time with respect to the first address signal.

6 Claims, 9 Drawing Sheets

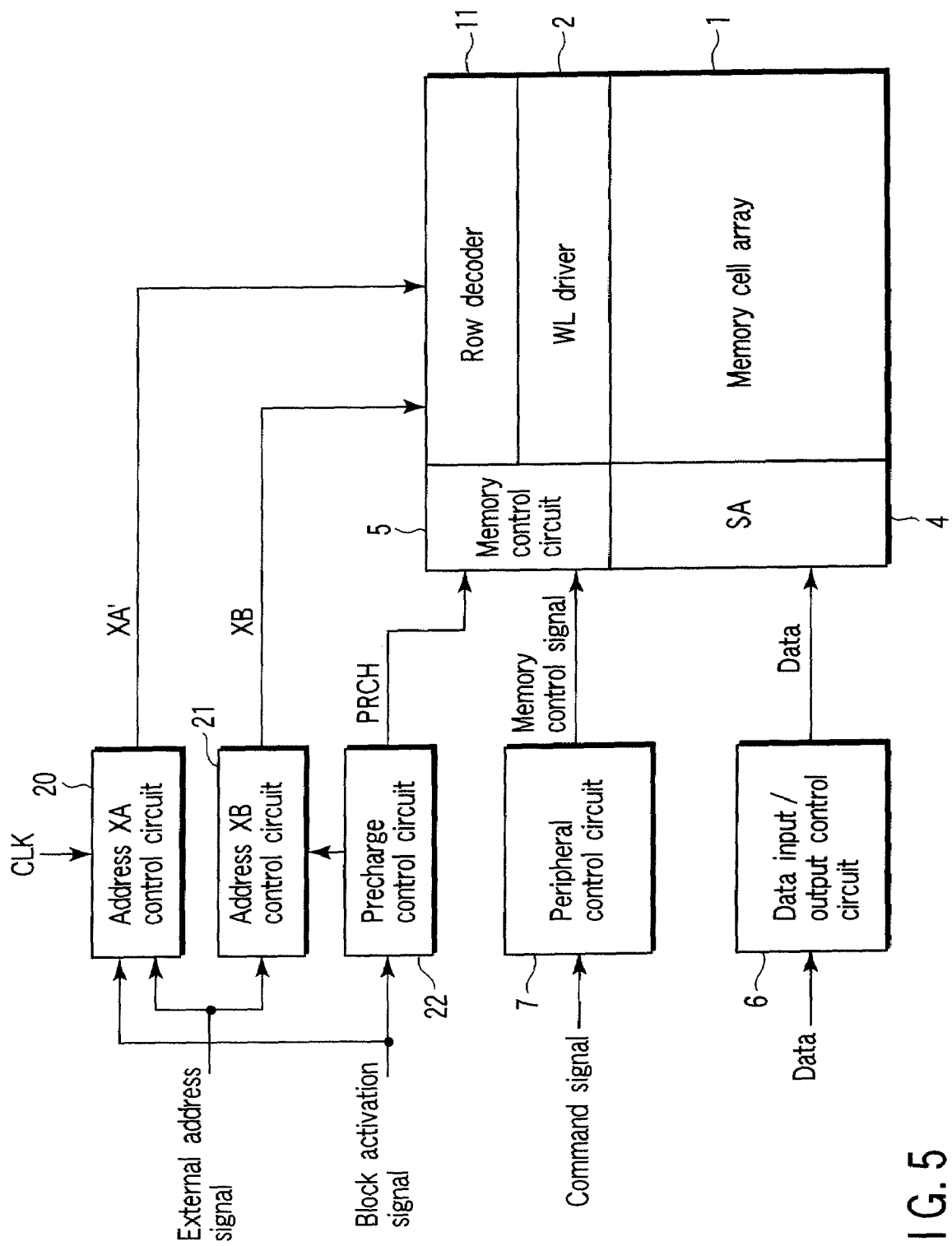
F I G. 5

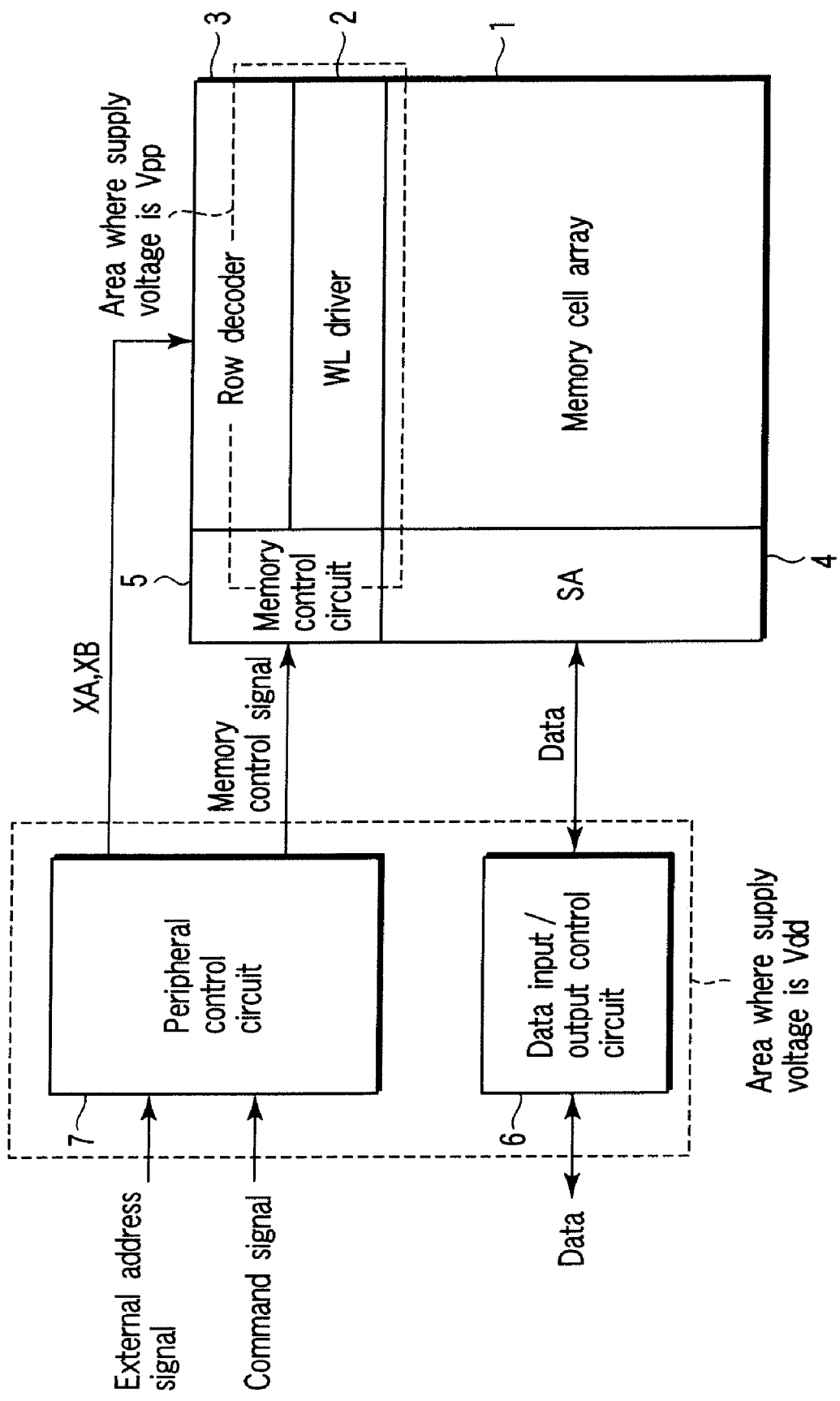
F I G. 10

SEMICONDUCTOR STORAGE DEVICE

CROSS-REFERENCE TO RELATED APPLICATIONS

This application is a divisional of U.S. patent application Ser. No. 11/002,243, filed Dec. 3, 2004 now U.S. Pat. No. 7,149,133, which is based upon and claims the and benefit of priority from prior Japanese Patent Application No. 2004-242454, filed Aug. 23, 2004, the entire contents of each of which are incorporated herein by reference.

BACKGROUND OF THE INVENTION

1. Field of the Invention

The present invention relates to a semiconductor memory device and more specifically a row decoder which activates word lines.

2. Description of the Related Art

In recent years, DRAMs (Dynamic Random Access Memories) using one-transistor/one-capacitor memory cells have made much progress in packing density and microstructuring because of improvements in memory cell structure and advances in fine-pattern processing technology and circuit design technology. Meanwhile, logic circuits with no DRAM have made progress in microstructuring and low-voltage version faster than DRAMs because the microstructuring directly leads to higher packing density and increased speed.

In the DRAMs, on the other hand, the voltage written into each memory cell and the voltage applied to the gate electrode of each transistor that connects a memory cell and a bit line cannot be scaled as much as the voltage that controls a logic circuit (logic voltage) because of stringent specifications to leakage current. Thus, in recent years a DRAM has been developed which uses a two- or three-supply-voltage system in which the supply voltage for the logic circuit surrounding DRAM and the supply voltage for a circuit surrounding the memory cells are different.

As this type of related technique a technique to transfer a high voltage to word lines with no voltage drop is disclosed in, for example, Jpn. Pat. Appln. KOKAI Publication No. 2002-63795.

BRIEF SUMMARY OF THE INVENTION

According to a first aspect of the invention, there is provided a semiconductor memory device comprising: a memory cell array in which a plurality of memory cells are arranged in a matrix form; a plurality of word lines connected to the memory cells; a row decoder including a plurality of decode sections and configured to receive first and second address signals for selecting the word lines, each of the decode sections which is provided for a respective one of the word lines, and includes first and second MOS transistors connected in series, the first MOS transistor having its gate electrode connected to receive the first address signal, the second MOS transistor having its gate electrode connected to receive the second address signal, the row decoder outputting a first signal for controlling the word lines; and a control circuit which delays the second address signal in time with respect to the first address signal.

According to a second aspect of the invention, there is provided a semiconductor memory device comprising: a memory cell array in which a plurality of memory cells are arranged in a matrix form; a plurality of word lines connected to the memory cells; first and second address control circuits which produce first and second address signals for selecting the word lines; a signal generating circuit which is responsive to an externally applied activation signal for activating the memory cell array to produce a second signal for placing the memory cell array in an active state or a precharged state; and a row decoder including a plurality of decode sections each of which is provided for a respective one of the word lines and includes first and second MOS transistors connected in series, the first MOS transistor having its gate electrode connected to receive the first address signal, the second MOS transistor having its gate electrode connected to receive the second address signal, the row decoder outputting a first signal for controlling the word lines, wherein the first address control circuit outputs the first address signal when the activation signal is activated, and the second address control circuit outputs the second address signal when the second signal indicating the active state is activated.

According to a third aspect of the invention, there is provided a semiconductor memory device comprising: a memory cell array in which a plurality of memory cells are arranged in a matrix form; a plurality of word lines connected to the memory cells; a plurality of detection circuits each of which is provided for a respective one of the word lines and detects whether or not first and second address signals for selecting the word lines have been activated; and a row decoder including a plurality of decode sections each of which is provided for a respective one of the detection circuits and includes a first MOS transistor having its gate electrode connected to the corresponding detection circuit, the row decoder outputting a first signal for controlling the word lines.

BRIEF DESCRIPTION OF THE SEVERAL VIEWS OF THE DRAWING

FIG. 5 is a block diagram of a DRAM according to a second embodiment of the present invention;

FIG. 10 is a block diagram of an investigative example of a DRAM;

DETAILED DESCRIPTION OF THE INVENTION

Figure 1:
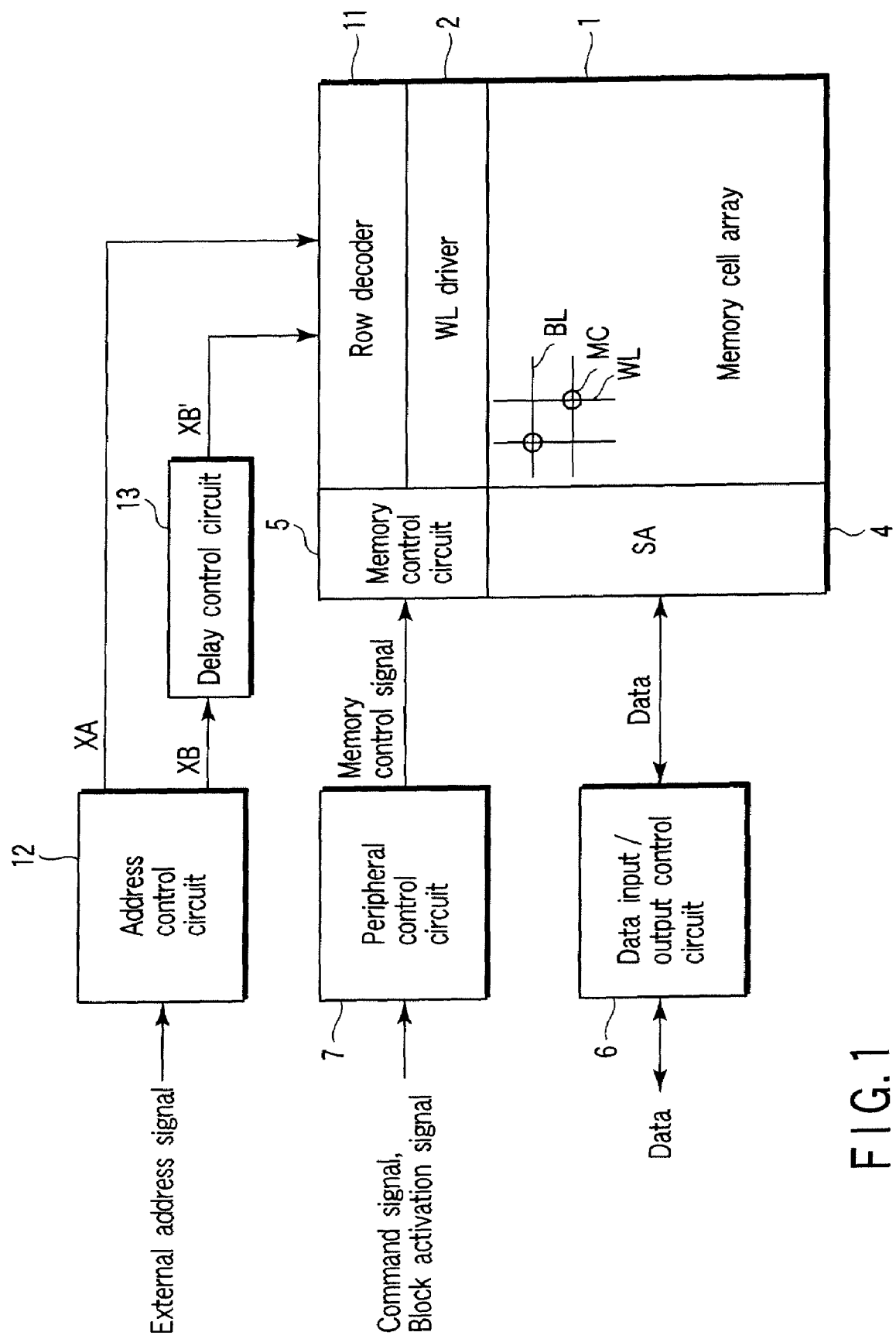
FIG. 1 is a block diagram of a DRAM according to a first embodiment of the present invention.

The inventors of the present invention investigated a DRAM described below before the development of the present invention.

FIG. 10 is a block diagram of the investigative example. A DRAM using a two-power-supply system will be described by way of example. Let the low supply voltage for logic be Vdd and the high supply voltage for controlling the periphery of memory cells, such as word lines, be Vpp. In the DRAM using such two supply voltages, the transistors used are constructed to suit their respective supply voltages.

Address signals and command signals are externally applied to the DRAM. The external address signals and command signals are received by a peripheral control circuit 7, which performs processing, such as decoding and redundancy check, on the external address signals and command signals, and outputs memory control signals and address signals XA and XB.

The memory control signals are applied to a memory control circuit 5. The address signals XA and XB are applied to a row decoder 3. That is, the address signals XA and XB are a row address signal to select a row. The memory control circuit 5 is responsive to the memory control signals to control the row decoder 3, a word line (WL) driver 2, and a sense amplifier circuit (SA) 4.

Input data is input to the DRAM from the external circuit. The input data is input through a data input/output control circuit 6 to the sense amplifier circuit (SA) 4. The sense amplifier circuit 4 reads from or writes into memory cells. Output data output from the SA 4 is output to the external circuit.

Among these circuits, circuits that are controlled with supply voltage Vpp (that is, the area where the supply voltage is Vpp) include part of the row decoder 3, the WL driver 2, and part of the circuit which controls the row decoder 3 and the WL driver 2. The other circuits are controlled with supply voltage Vdd (that is, the area where supply voltage is Vdd).

With circuits thus formed using two supply voltages, conversion from Vdd to Vpp is required somewhere. In a system to select a word line WL, a configuration is often adopted in which the row decoder 3 receives a Vdd-based address signal and then sends a Vpp-based signal to the WL driver 2 from the points of view of chip size, operating speed, and power dissipation. In this investigative example as well, such a configuration is adopted.

Figure 11:
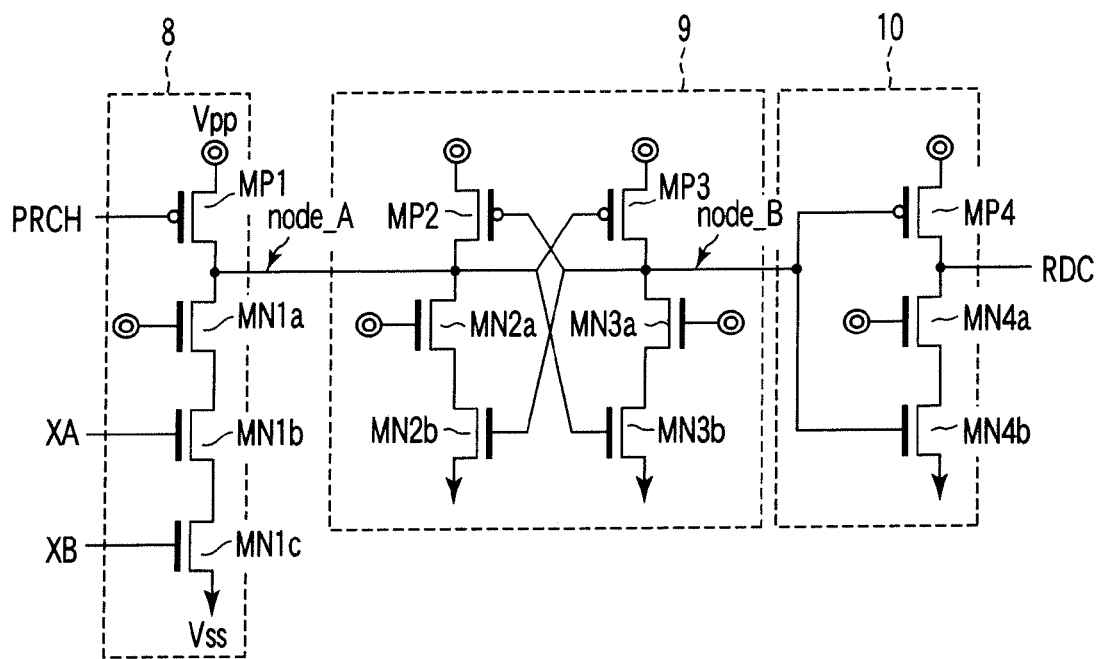
FIG. 11 is a circuit diagram of the row decoder shown in FIG. 10.

FIG. 11 is a circuit diagram of the row decoder 3 shown in FIG. 10. The row decoder 3 is of a dynamic type. The row decoder 3 comprises a decode section 8 at a first stage, a latch section 9 at second and third stages which latches decoded information (data stored at the decoded information node (node_A), and an output driver 10 at a fourth stage.

The decode section 8 is composed of a P-type MOS transistor MP1 and three N-type MOS transistors MN1a, MN1b, and MN1c. The latch section 9 is composed of two P-type MOS transistors MP2 and MP3 and four N-type MOS transistors MN2a, MN2b, MN3a, and MN3b. The output driver 10 is composed of a P-type MOS transistor MP4 and two N-type MOS transistors MN4a and MN4b.

The N-type MOS transistors (MN1a, MN2a, MN3a, and MN4a) each of which is arranged in the middle of a respective one of the stages and impressed at its gate electrode with Vpp are buffer transistors. Each of the buffer transistors is adapted to prevent a high voltage from being applied between the source and drain electrodes of a corresponding one of the N-type MOS transistors (MN1b, MN2b, MN3b, and MN4b) which is connected to it.

A precharge signal PRCH input to the transistor MP1 in the decode section 8 is the signal to switch between active and precharge periods of the memory cell array 1. The precharge signal PRCH is a Vpp-based signal. The address signals XA and XB are Vdd-based signals.

Figure 12:
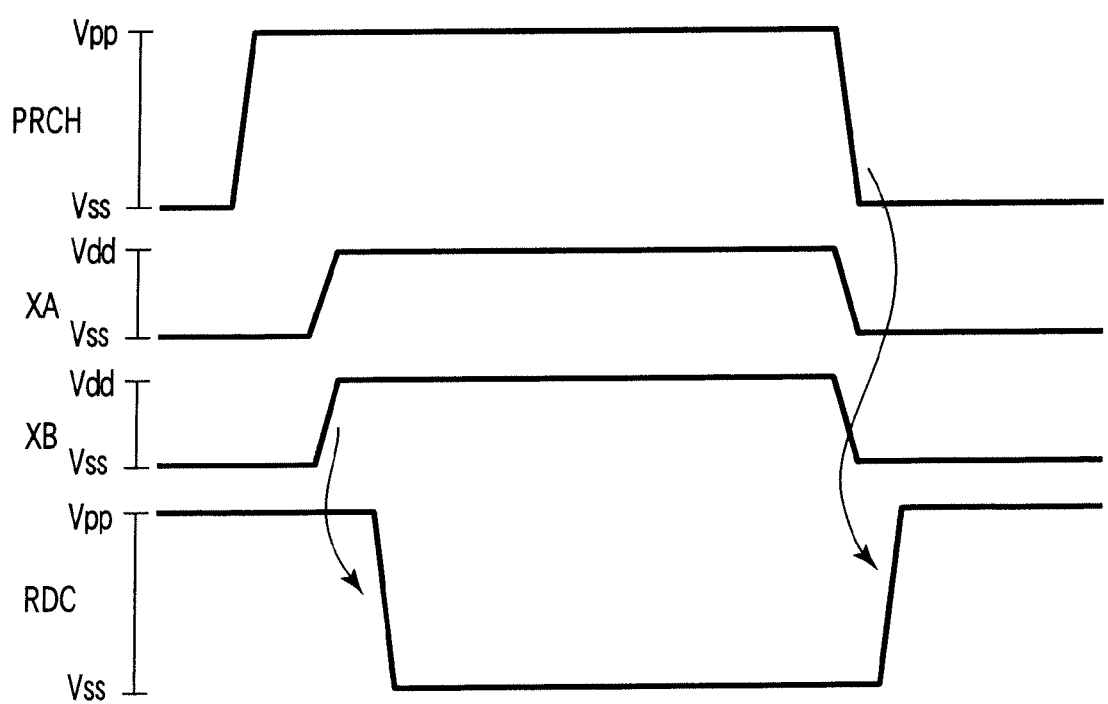
FIG. 12 is a timing diagram explanatory of the operation of the row decoder shown in FIG. 11.

The operation of the row decoder 3 thus configured will be described. FIG. 12 is a timing diagram explanatory of the operation of the row decoder 3.

When a certain block in the memory cell array 1 is activated in order to read from or write into a memory cell in that block, the signal PRCH goes from a low level to a high level. As the result, the decoded information node (node_A) is latched lightly by the latch section 9.

Next, in the case where the address signals XA and XB are selected, the potential of the decoded information node (node_A) is pull down to ground potential Vss. As the result, the output signal RDC drops to the low level. The precharge operation is opposite to the above operation. That is, by causing the address signals XA and XB and the signal PRCH to go to the low level, the decoded information node (node_A) becomes charged to Vpp. As the result, the output signal RDC also returns to Vpp.

In the row decoder 3, the circuit that most affects the operating speed is the decode section 8 at the first stage. The reason is that the three N-type MOS transistors MN1a, MN1b and MN1c are connected in series to the decoded information node (node_A) and the two lower N-type MOS transistors MN1b and MN1c are impressed at their gate electrode with only Vdd.

In the age where the voltage Vdd was high to some extent, careful designing of circuit constants prevented the operating speed of the row decoder 3 from becoming a problem. However, as transistors are scaled down and the voltage Vdd is lowered, it takes time to pull down the potential at the decoded information node (node_A). This will lower the operating speed of not only the row decoder 3 but also the DRAM itself.

Hereinafter, preferred embodiments of the present invention implemented on the basis of such knowledge will be described with reference to the accompanying drawings. In the description which follows, the same or functionally equivalent elements are denoted by like reference numerals and repeated descriptions thereof are given only when necessary.

First Embodiment

FIG. 1 is a block diagram of a DRAM according to a first embodiment of the present invention. In the memory cell array 1, memory cells are arranged in a matrix form (rows and columns). Each memory cell is composed of one cell transistor and one cell capacitor. That is, the memory cell array 1 has a plurality of dynamic memory cells. The memory cell array 1 is divided into a predetermined number of blocks each of which has a plurality of memory cells.

A plurality of bit lines BL and a plurality of word lines WL are provided in the memory cell array 1. Each memory cell is placed at an intersection between the bit lines BL and word lines WL. Each bit line BL is connected through cell transistors to cell capacitors at their one electrode. Each word line is connected to the gate electrodes of cell transistors. The other electrode of each cell capacitor is connected to a predetermined potential.

The bit lines BL are connected to sense amplifier circuits (SA) 4. The word lines WL are connected to the WL drivers 2 each of which is in turn connected to the row decoder 11.

To the DRAM is externally applied an external address signal, which is received by the address control circuit 12.

The address control circuit 12 performs processing, such as decoding, on the external address signal to output address signals XA and XB.

Each of the address signals XA and XB is comprised of a plurality of signals. For example, if the row decoder 11 controls 64 word lines, the address signal XA comprises XA0, XA1, XA2, XA3, XA4, XA5, XA6, and XA7 and the address signal XB comprises XB0, XB1, XB2, XB3, XB4, XB5, XB6, and XB7. The address control circuit 12 causes one of the signals of each of the address signals XA and XB to go high to thereby make a selection from the 64 word lines.

A delay control circuit 13 produces an address signal XB' from the address signal XB from the address control circuit 12. The operation of the delay control circuit 13 will be described later. The row decoder 11 makes a selection from the word lines in response to the address signals XA and XB. The WL drivers 2 applies the word line drive voltage Vpp to a word line selected by the row decoder 11.

The memory control circuit 5 applies control signals to the row decoder 11, the WL drivers 2 and the sense amplifier circuits 4. The control operation of the memory control circuit 5 is performed in response to memory control signals from the peripheral control circuit 7.

To the peripheral control circuit 7 is externally applied a block activation signal, which, in reading from or writing into a memory cell in a certain block, activates that block. The peripheral control circuit 7 is responsive to the block activation signal to produce a precharge signal PRCH. The memory control signals indicated in FIG. 1 contains the signal PRCH.

The precharge signal PRCH switches between active and precharge periods of the memory cell array 1. The active period is the one during which the memory cell array 1 is read from or written into. The precharge period is the one during which the bit lines are precharged to a given potential without reading from or writing into the memory cell array. During the precharge period, the signal PRCH is set low. During the active period, on the other hand, the signal PRCH is set high.

Figure 2:
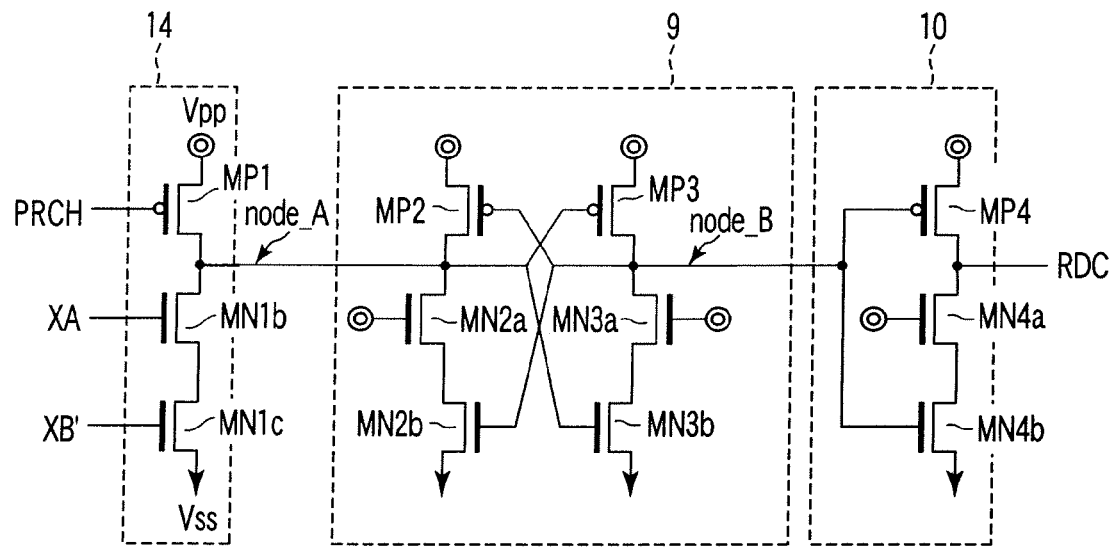
FIG. 2 is a circuit diagram of the row decoder shown in FIG. 1.

The configuration of the row decoder 11 will be described next. FIG. 2 illustrates the circuit arrangement of one decode unit of the row decoder 11 shown in FIG. 1. Unlike the row decoder shown in FIG. 11, in the row decoder shown in FIG. 2, the buffer transistor MN1a is not used.

Though not specified in FIG. 2, each of the address signals XA and XB consists of two or more signals. For example, if the row decoder has 64 decode units, then the address signals XA and XB comprise a set of signals (XA0, XA1, XA2, XA3, XA4, XA5, XA6, and XA7) and a set of signals (XB0, XB1, XB2, XB3, XB4, XB5, XB6, and XB7), respectively. By selectively setting high only one signal of each set of the signals, only one of the 64 decode units is enabled.

The row decoder 11 includes a decode section 14, a latch section 9, and an output driver 10. Specifically, the decode section 14 forms the first stage of the decode unit, the latch section 9 forms the second and third stages, and the output driver 10 forms the fourth stage.

The decode section 14 is input with the precharge signal PRCH and the address signals XA and XB. The precharge signal PRCH is supplied from the peripheral control circuit 7 through the memory control circuit 5. The decode section 14 is constructed from one P-type MOS transistor MP1 and two N-type MOS transistors MN1b and MN1c. The transistor MP1 has its source electrode connected to the supply voltage Vpp, its gate electrode connected to receive the signal PRCH, and its drain electrode connected to the decoded information node (node_A).

The transistor MN1b has its drain electrode connected to the decoded information node (node_A), its gate electrode connected to receive the address signal XA, and its source electrode connected to the drain electrode of the transistor MN1c. The transistor MN1c has its gate electrode connected to receive the address signal XB' and its source electrode connected to ground potential Vss.

The latch section 9 is constructed from two P-type MOS transistor MP2 and MP3 and four N-type MOS transistors MN2a, MN2b, MN3a, and MN3b.

The transistor MP3 has its source electrode connected to supply voltage Vpp, its gate electrode connected to the decoded information node (node_A), and its drain electrode connected to the node (node_B).

The transistor MN3a has its drain electrode connected to the (node_B), its gate electrode connected to supply voltage Vpp, and its source electrode connected to the drain electrode of the transistor MN3b. The transistor MN3b has its gate electrode connected to the decoded information node (node_A) and its source electrode connected to ground potential Vss.

The transistor MP2 has its source electrode connected to supply voltage Vpp, its gate electrode connected to the node (node_B), and its drain electrode connected to the node (node_A).

The transistor MN2a has its drain electrode connected to the node (node_A), its gate electrode connected to supply voltage Vpp, and its source electrode connected to the drain electrode of the transistor MN2b. The transistor MN2b has its gate electrode connected to the node (node_B) and its source electrode connected to ground potential Vss.

The latch section 9 latches data at the decoded information node (node_A) and transfers the inverse of the data at the node (node_A) to the node (node_B).

The output buffer 10 is composed of one P-type MOS transistor MP4 and two N-type MOS transistors MN4a and MN4b.

The transistor MP4 is connected at its source electrode to supply voltage Vpp, at its gate electrode to the node (node_B), and at its drain electrode to the drain electrode of the transistor MN4a.

The transistor MN4a has its gate electrode connected to supply voltage Vpp, and its source electrode connected to the drain electrode of the transistor MN4b. The transistor MN4b has its gate electrode connected to the node (node_B) and its source electrode connected to ground potential Vss.

The output driver 10 outputs a word line select signal RDC at the node at which the drain electrode of the transistor MP4 and the drain electrode of the transistor MN4a are connected together.

The transistors constituting the row decoder 11 consist of ones adapted for supply voltage Vpp. That is, the transistors constituting the row decoder (transistors that handle Vpp-based signals) are set higher in threshold voltage than the transistors forming the address control circuit 12 and the like (transistors that handle Vdd-based signals).

Figure 3:
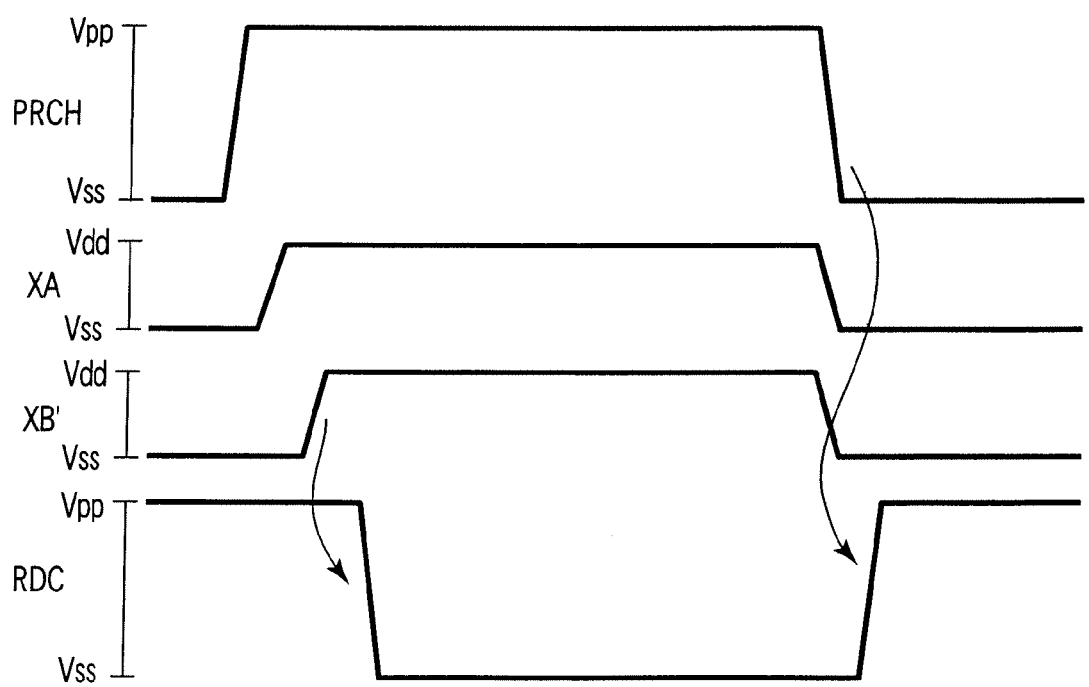
FIG. 3 is a timing diagram explanatory of the operation of the row decoder.

Referring now back to FIG. 1, the DRAM is provided with the delay control circuit 13, which is adapted to delay the address signal XB from the address control circuit 12 in time, thereby introducing a displacement between the times at which the address signals XA and XB enter the decode section 14. FIG. 3 is a timing diagram explanatory of the operation of the row decoder 11.

When a certain block of the memory cell array 1 is activated in order to read from or write into a memory cell contained in that block, the signal PRCH goes from a low level to high level. Thereby, the transistor MP1 is turned off. As the result, the decoded information is lightly latched by the latch section 9.

Next, the address signal XA goes to the high level, thereby turning the transistor MN1b on. At this point, the address signal XB' still remains the low level.

Next, the address signal XB' goes to the high level a predetermined time after the address signal XA has gone to the high level, thereby turning the transistor MN1c on. When both the transistors MN1b and MN1c are turned on, the potential at the decoded information node (node_A) goes to the low level. Thus, the row decoder 11 outputs a signal RDC at the low level.

When the row decoder 11 outputs the signal RDC at low level, the corresponding word line is selected. Specifically, the WL driver 2 responds to the signal RDC to activate the word line.

The signal PRCH is controlled to return to the low level a predetermined time after it has gone to the high level. To this end, the DRAM may be provided with a timer circuit, in which case the predetermined time is determined on the basis of a count in the timer circuit. Alternatively, a signal which deactivates a block (block deactivation signal) may be input from outside to cause the signal PRCH to go low.

With the DRAM thus configured, since the transistor MN1c is in the nonconductive state when the address signal XA goes to the high level, the period during which a high voltage is applied between the drain and source electrodes of the transistor MN1b can be shortened.

In addition, the transistor MN1c is merely subjected to a voltage which is lower than the voltage at the node (node_A) by the threshold voltage of the transistor MN1b. It therefore becomes possible to prevent a high voltage from being applied between the drain and source electrodes of the transistor MN1c. It therefore becomes possible to remove the conventionally required buffer transistor MN1a.

Figure 4:
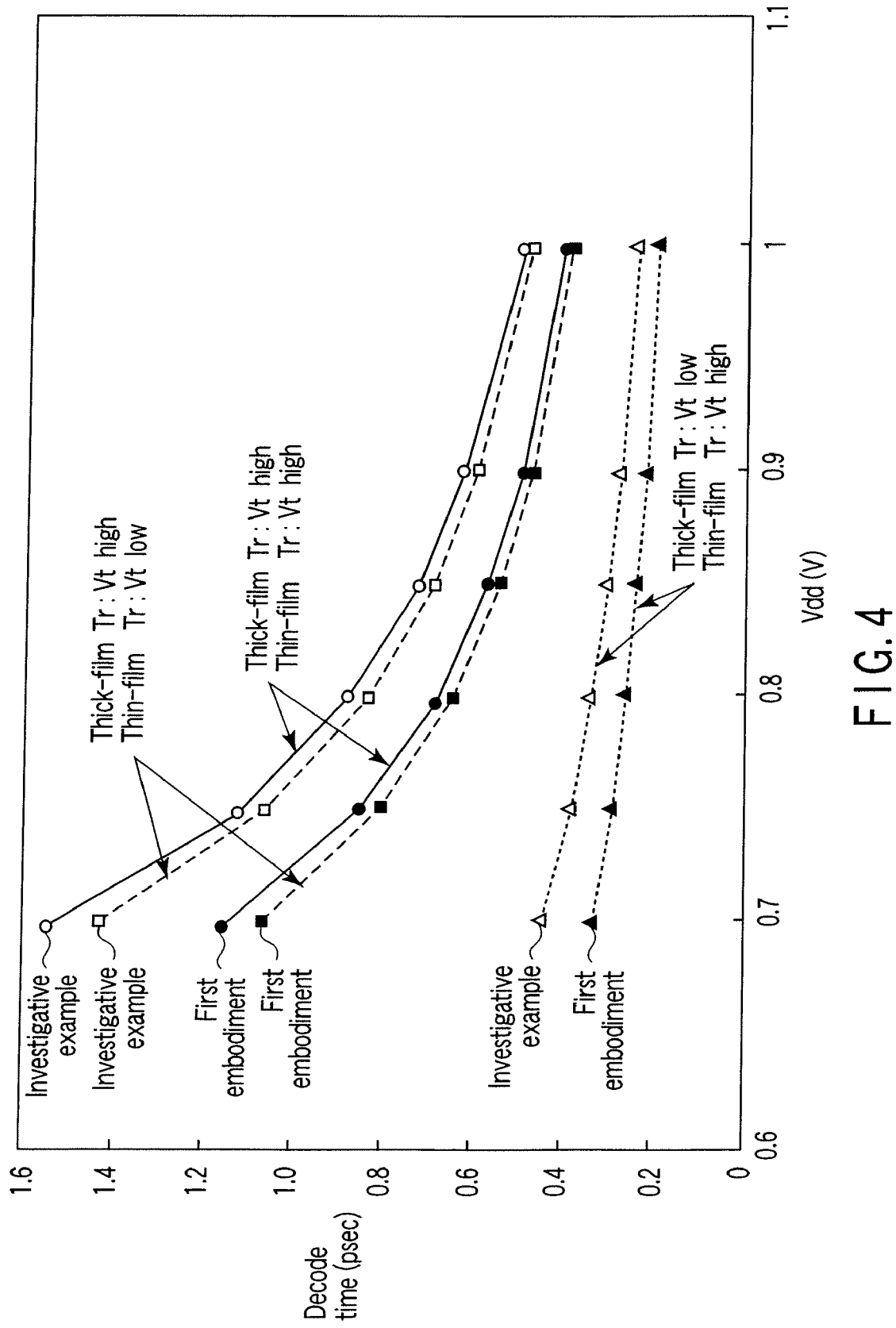
FIG. 4 shows decode time versus voltage Vdd for the row decoder.

FIG. 4 shows decode time versus voltage Vdd for the row decoder 11 with a characteristic of transistors as a parameter. Also, FIG. 4 shows comparisons of the row decoder 11 (FIG. 2) of the first embodiment with the row decoder 3 (FIG. 11) of the investigative example. In FIG. 4, the decode time (psec) of the row decoder 11 is shown on the vertical axis and the voltage Vdd (V) is shown on the horizontal axis.

Here, the characteristic of transistors is the threshold voltage (Vt). When the threshold voltage of a transistor is high, a current which can flow through that transistor is small when a predetermined voltage is applied to its gate electrode. When the threshold voltage of a transistor is low, on the other hand, a current which can flow through that transistor is large when the predetermined voltage is applied to its gate electrode.

When transistors having thick gate oxide films which are the most suitable for the voltage Vpp (thick-film transistors) and transistors having thin gate oxide films which are the most suitable for the voltage Vdd (thin-film transistors) are high in threshold voltage, it can be seen that this embodiment is improved in decode time in comparison with the investigative example. Moreover, in a case as well where the threshold voltage of thick-film transistors is high and the threshold voltage of thin-film transistors is low, it can be seen that this embodiment is improved in decode time in comparison with the investigative example. Furthermore, in a case as well where the threshold voltage of thick-film transistors is low and the threshold voltage of thin-film transistors is high, it can be seen that this embodiment is superior in decode time to the investigative example.

As described in detail above, in this embodiment, the decode section 14 of the row decoder 11 is provided with the two series-connected transistors MN1b and MN1c. Of address signals XA and XB to select a word line, the address signal XA is applied to the gate electrode of the upper transistor MN1b and the address signal XB is applied to the gate electrode of the lower transistor MN1c. The address signal XB is caused to enter the row decoder 11 later than the address signal XA.

According to the present embodiment, therefore, the period during which a high voltage is applied across the drain-to-source path of the transistor MN1b can be shortened. It therefore becomes possible to remove the conventionally required buffer transistor MN1a.

The removal of the buffer transistor MN1a will allow the operating speed of the row decoder 11 to be increased and the circuit area of the row decoder to be reduced.

In addition, degradation in the operating speed of the row decoder 11 under a condition in which the voltage Vdd is low can be suppressed.

Second Embodiment

The address signals XA and XB are produced by decoding an external address signal. If the address signals XA and XB were input to the row decoder 11 in the precharged state, a through current would flow through the decode section 14. For this reason, the address signals XA and XB are caused to enter the row decoder 11 after the signal PRCH has gone high.

Thus, the access time to a word line is determined by the time at which the address signals XA and XB are input to the row decoder 11. For this reason, the time from when the signal PRCH goes high until the address signals XA and XB are input to the row decoder is set to the shortest possible time.

However, if, as in the first embodiment, the address signals XA and XB are input to the row decoder with a time difference therebetween, the time at which the address signal XB is input later determines the access time to a word line. Thus, the access time to a word line increases by the time difference between the address signals XA and XB. The second embodiment is intended to solve such a problem.

FIG. 5 is a block diagram of a DRAM according to the second embodiment of the present invention. A block activation signal is externally applied to the DRAM. The block activation signal is input a precharge control circuit 22 and an address XA control circuit 20.

The precharge control circuit 22 is responsive to the block activation signal to produce a precharge signal PRCH, which is in turn applied to the row decoder 11 via the memory control circuit 5 and to an address XB control circuit 21.

The address XA control circuit 20 is responsive to an external address signal to produce an address signal XA' and outputs it at the same time the block activation signal is input thereto. The address signal XA1 is input to the row decoder 11.

The address XB control circuit 21 is responsive to the external address signal to produce an address signal XB' and outputs it at the same time the precharge signal goes high. The address signal XB' is input to the row decoder 11.

As the result, the address signal XA' is input to the row decoder 11 earlier than the address signal XB. Specifically, the address signal XA' is input to the row decoder 11 earlier than the address signal X by the time required for the precharge control circuit 22 to produce the precharge signal PRCH.

A clock CLK is externally input to the DRAM. The clock CLK is applied to the address XA control circuit 20 and the other circuits (including the address XB control circuit 21, the precharge control circuit 22, the peripheral control circuit 7, the data input/output control circuit 6, etc.). The DRAM operates in synchronization with the clock CLK.

Figure 6:
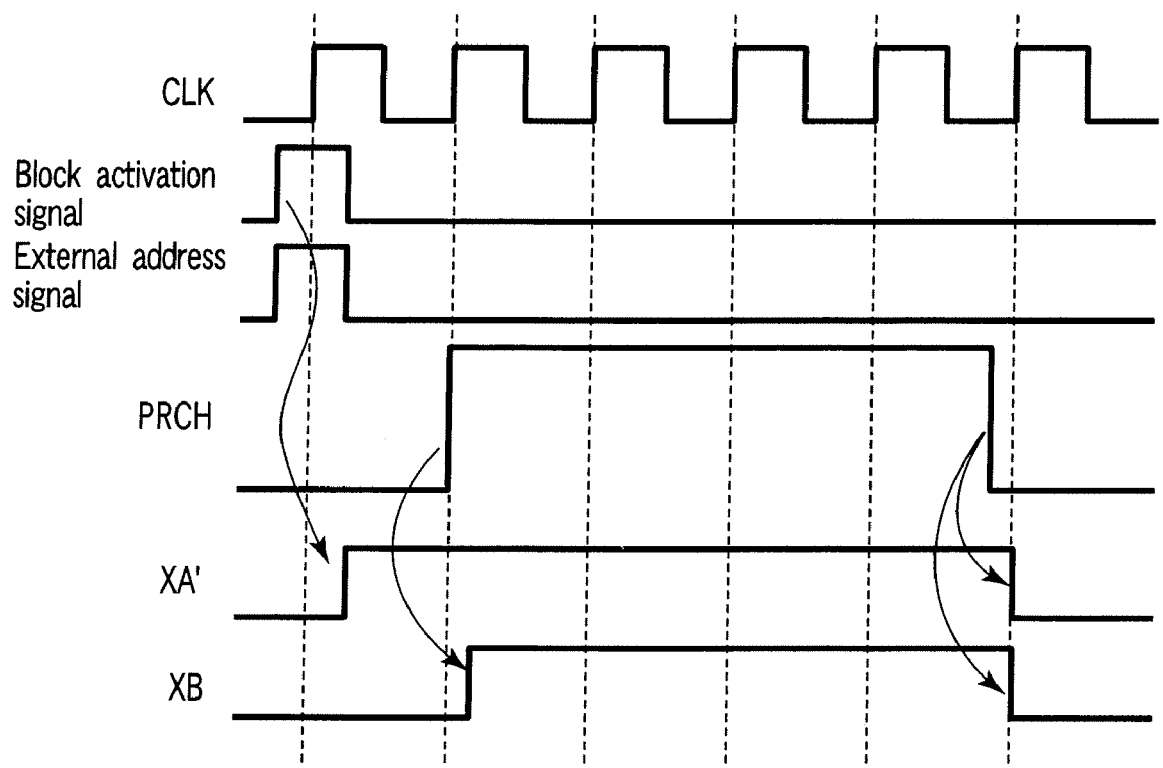
FIG. 6 is a timing diagram explanatory of the operation of the DRAM shown in FIG. 5.

The operation of the DRAM shown in FIG. 5 will be described next. FIG. 6 is a timing diagram explanatory of the operation of the DRAM. The configuration of the row decoder 11 remains unchanged from that in the first embodiment.

The address signal XA' goes to the high level at the time when the block activation signal is activated (raised to a high level), thereby turning the transistor MN1b on. That is, the address signal XA' is input to the row decoder 11 earlier than conventional. At this point, the address signal XB still remains low level.

Next, the signal PRCH goes to the high level, whereby the transistor MP1 is turned off. As the result, the decoded information is lightly latched by the latch section 9.

Next, the address signal XB goes to the high level at the time when the signal PRCH goes to the high level, thereby causing the transistor MN1c to be turned on. Turning both the transistors MN1b and MN1c on causes the potential at the decoded information node (node_A) to go to the low level. As the result, the row decoder 11 provides a signal RDC at the low level.

With the DRAM thus configured, the address signal XA' is fed into the row decoder 11 before the address signal XB although there is a time difference between the address signals XA' and XB. For this reason, the input of the address signal XB to the row decoder will not be delayed.

The problem of through current is eliminated because the address signal XB is input to the row decoder after the signal PRCH has been activated. Thus, the configuration of the second embodiment can be realized because the restrictions on the input of the address signal XA' to the row decoder are removed.

According to the second embodiment, therefore, it becomes possible to prevent the time required by the row decoder 11 to make access to a word line from increasing. The other advantages are the same as those of the first embodiment.

Third Embodiment

Figure 7:
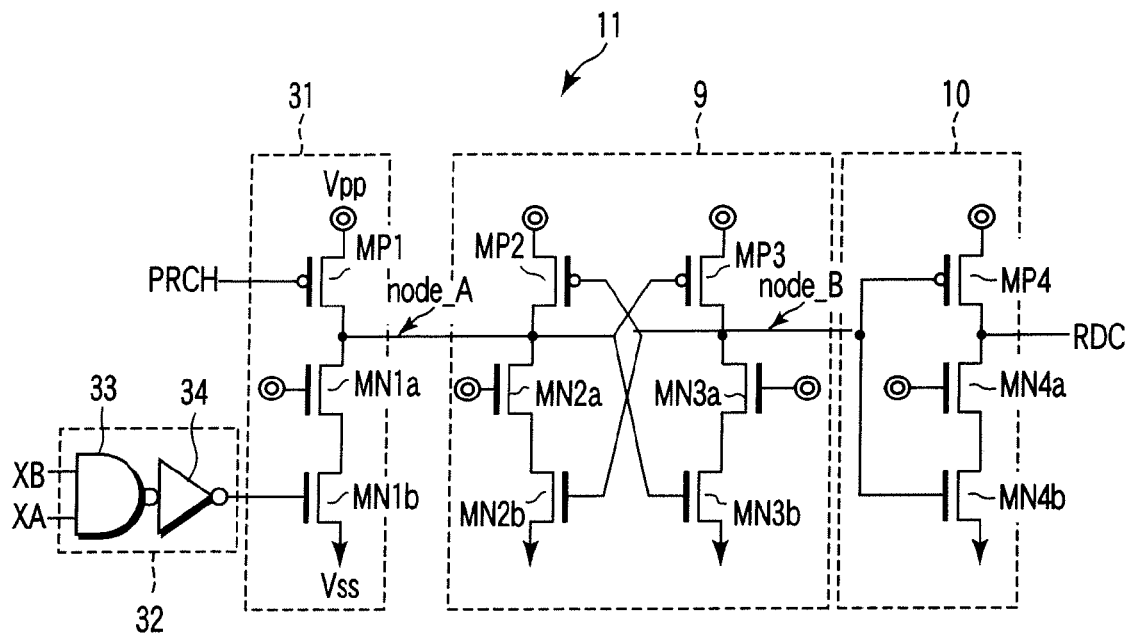
FIG. 7 is a circuit diagram of a row decoder according to a third embodiment of the present invention.

FIG. 7 is a circuit diagram of a row decoder according to a third embodiment of the present invention.

A decode section 31 is composed of one P-type MOS transistor MP1 and two N-type MOS transistors MN1a and MN1b. The transistor MN1a is a buffer transistor.

The row decoder 11 is provided with an address signal detection circuit 32, which is comprised of a NAND circuit 33 and an inverter circuit 34. The address signal detection circuit 32 is constructed using Vdd-based thin-film transistors.

The address signal detection circuit 32 is connected to receive address signals XA and XB and outputs a high-level signal to the gate electrode of the transistor MN1b when both the address signals XA and XB go to the high level.

The other circuit arrangement remains unchanged from the DRAM shown in FIG. 10. There are no particular restrictions on the timing of inputting the address signals XA and XB to the row decoder. The timing of inputting the address signals may be the same as that described in connection with FIG. 11.

Figure 8:
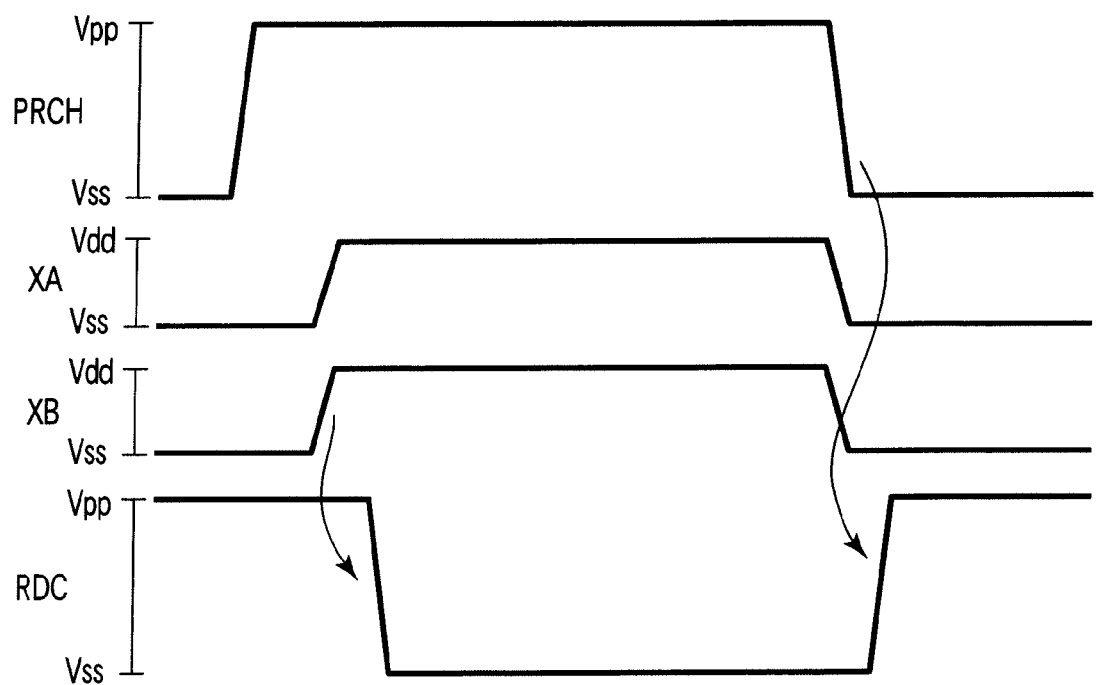
FIG. 8 is a timing diagram explanatory of the operation of the row decoder of FIG. 7.

The operation of the row decoder 11 shown in FIG. 7 will be described next. FIG. 8 is a timing diagram explanatory of the operation of the row decoder 11.

When a certain block of the memory cell array 1 is activated in order to read from or write into a memory cell contained in that block, the signal PRCH goes from a low level to a high level. Thereby, the transistor MP1 is turned off. As the result, the decoded information is lightly latched by the latch section 9.

Next, both the address signals XA and XB go to the high level, whereupon the address signal detection circuit 32 applies a high-level signal to the gate electrode of the transistor MN1b, causing it to turn on. As the result, the potential at the decoded information node (node_A) goes to the low level. Thus, the row decoder 11 outputs a signal RDC at the low level.

Such a configuration allows N-type MOS transistors in the decode section 31 to be implemented in the form of series connection of two stages. This provides an advantage that degradation in the operating speed of the row decoder 11 under a condition in which the voltage Vdd is low can be suppressed.

Figure 9:
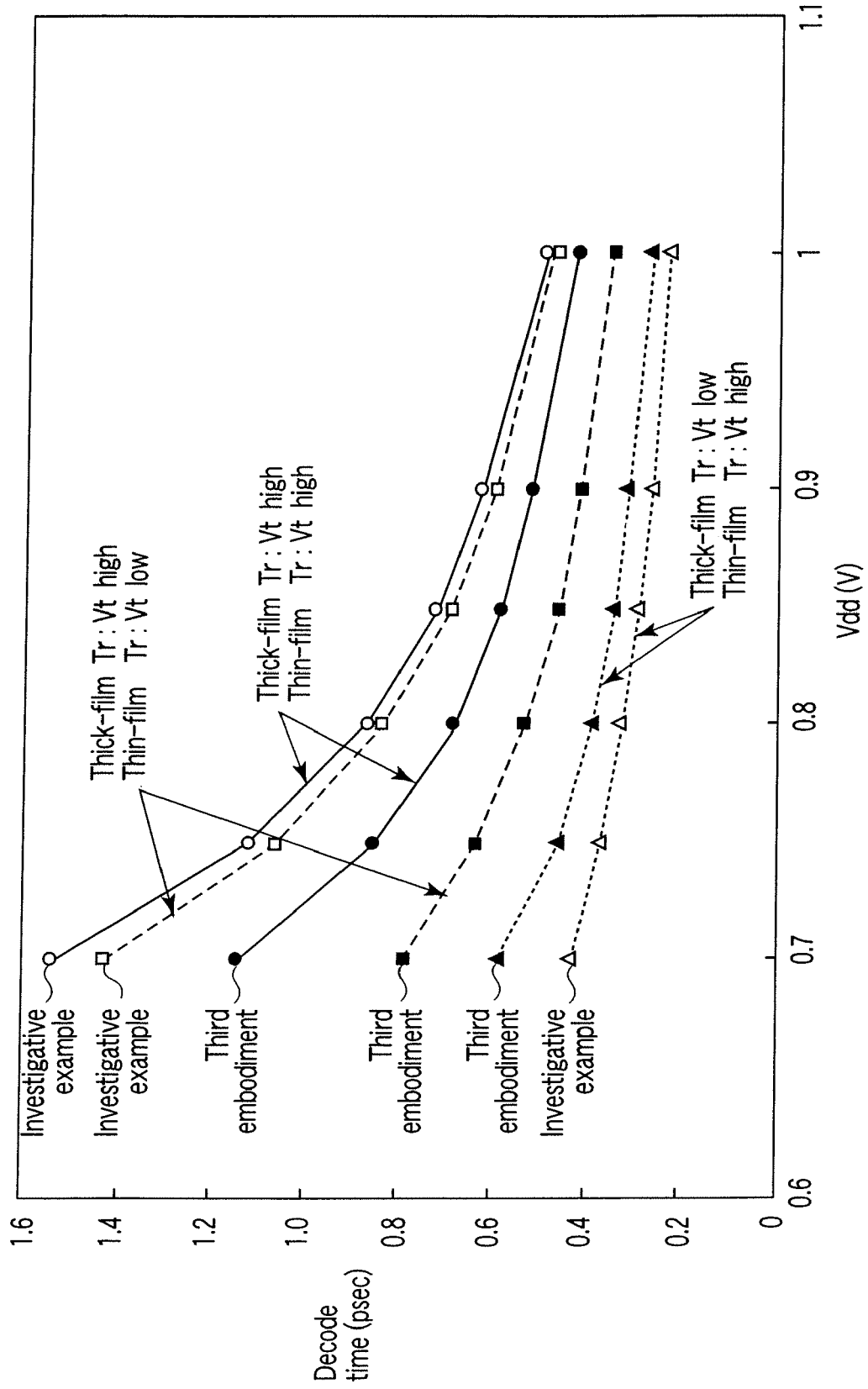
FIG. 9 shows decode time versus voltage Vdd for the row decoder of FIG. 7.

FIG. 9 shows decode time versus voltage Vdd for the row decoder 11 with a characteristic of transistors as a parameter. Also, FIG. 9 shows comparisons of the row decoder 11 (FIG. 2) of the third embodiment with the row decoder 3 (FIG. 11) of the investigative example.

When thick-film transistors and thin-film transistors are high in threshold voltage (Vt), it can be seen that this embodiment is improved in decode time in comparison with the investigative example. Moreover, in a case as well where the threshold voltage of thick-film transistors is high and the threshold voltage of thin-film transistors is low, it can be seen that this embodiment is improved in decode time in comparison with the investigative example. This indicates that the configuration in which the address signal detection circuit 32 comprised of logic circuits is added to the series connection of two N-type MOS transistors is higher in operating speed than the configuration in which three N-type MOS transistors are connected in series (see FIG. 11).

When the threshold voltage of thin-film transistors is high and the threshold voltage of thick-film transistors is low, the investigative example is shorter in decode time. The reason is that the difference in the number of N-type MOS transistors connected in series in the decode section does not much affect the operating speed because the thick-film transistors are low in threshold voltage and the amount of delay caused by the address signal detection circuit 32 is increased because the thin-film transistors are high in threshold voltage.

The condition that the threshold voltage of thin-film transistors is high and the threshold voltage of thick-film transistors is low is one for short decode time as compared with other conditions. It is the decode time when both the thick-film transistors and thin-film transistors are high in threshold voltage that determines the overall performance of the DRAM. Thus, that the embodiment is worse than the investigative example under that condition is not a serious problem.

According to the third embodiment, therefore, the number of N-type MOS transistors in the decode section 31 that operate on address signals XA and XB can be reduced to one. As the result, the decode time of the row decoder 11 can be shortened.

Furthermore, the operating speed of the row decoder 11 under the condition that the threshold voltage of thick-film transistors is high can be increased more than in the case of the first embodiment.

In the embodiments described so far, the address signals (specifically, row address signals) need not be limited to two in number (address signals XA and XB) but may be three or more. Under such a circumstance, a row decoder can be implemented similarly to the embodiments described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells are arranged in a matrix form;
   a plurality of word lines connected to the memory cells;
   first and second address control circuits which produce first and second address signals for selecting the word lines;
   a signal generating circuit which is responsive to an externally applied activation signal for activating the memory cell array to produce a second signal for placing the memory cell array in an active state or a precharged state; and
   a row decoder including a plurality of decode sections each of which is provided for a respective one of the word lines and includes first and second MOS transistors connected in series, the first MOS transistor having its gate electrode connected to receive the first address signal, the second MOS transistor having its gate electrode connected to receive the second address signal, the row decoder outputting a first signal for controlling the word lines,
   wherein the first address control circuit outputs the first address signal when the activation signal is activated, and the second address control circuit outputs the second address signal when the second signal indicating the active state is activated.

2. The semiconductor memory device according to claim 1, wherein each of the decode sections includes a first power supply which supplies a first voltage for driving the word lines, a third MOS transistor connected between the first power supply and the first MOS transistor and having its gate electrode connected to receive the second, a second power supply which supplies ground potential and is connected to the second MOS transistor, and a connection node which connects the first MOS transistor and the third MOS transistor and outputs decoded data corresponding to the first signal, and wherein the third MOS transistor supplies the connection node with the first voltage when its gate electrode receives the second signal indicating the precharged state, and does not supply the connection node with the first voltage when its gate electrode receives the second signal indicating the active state.

3. The semiconductor memory device according to claim 2, wherein the first and second signals have the first voltage, and the first and second address signals have a second voltage lower than the first voltage.

4. The semiconductor memory device according to claim 3, wherein the first and second MOS transistors have a threshold voltage corresponding to the second voltage and the third MOS transistor has a threshold voltage corresponding to the first voltage.

5. The semiconductor memory device according to claim 2, wherein the row decoder includes a latch circuit which latches the decoded data at the connection node.

6. The semiconductor memory device according to claim 1, further comprising a drive circuit which drives the word lines on the basis of the first signal.

* * * * *